(12) United States Patent
Aqad et al.

(10) Patent No.: US 9,110,369 B2
(45) Date of Patent: Aug. 18, 2015

(54) PHOTOACID GENERATOR, PHOTORESIST, COATED SUBSTRATE, AND METHOD OF FORMING AN ELECTRONIC DEVICE

(71) Applicant: Rohm and Haas Electronic Materials LLC, Marlborough, MA (US)

(72) Inventors: Emad Aqad, Northborough, MA (US); Irvinder Kaur, Westborough, MA (US); Cong Liu, Shrewsbury, MA (US); Cheng-bai Xu, Southborough, MA (US); Mingqi Li, Shrewsbury, MA (US); Gregory P. Prokopowicz, Worcester, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 87 days.

(21) Appl. No.: 13/925,926

(22) Filed: Jun. 25, 2013

(65) Prior Publication Data

US 2013/0344438 A1    Dec. 26, 2013

Related U.S. Application Data

(60) Provisional application No. 61/664,499, filed on Jun. 26, 2012.

(51) Int. Cl.
| | |
|---|---|
| *G03F 7/004* | (2006.01) |
| *C07C 309/06* | (2006.01) |
| *C07C 309/07* | (2006.01) |
| *G03F 7/20* | (2006.01) |
| *G03F 7/039* | (2006.01) |

(52) U.S. Cl.
CPC .............. *G03F 7/004* (2013.01); *G03F 7/0045* (2013.01); *G03F 7/0395* (2013.01); *G03F 7/20* (2013.01)

(58) Field of Classification Search
CPC .. C07C 309/02; C07C 309/06; C07C 309/07; C07C 309/09; G03F 7/004; G03F 7/0045; G03F 7/039; G03F 7/0392; G03F 7/20; G03F 7/2002
USPC .............. 430/270.1, 322, 326, 921, 923, 924, 430/925; 549/453; 562/30, 100, 108, 109, 562/113
See application file for complete search history.

(56) References Cited

U.S. PATENT DOCUMENTS

| | | | |
|---|---|---|---|
| 759,624 A | 5/1904 | MacMulkin | |
| 5,279,921 A | 1/1994 | Onishi et al. | |
| 7,301,047 B2 | 11/2007 | Yoshida et al. | |
| 7,304,175 B2 | 12/2007 | Harada et al. | |
| 7,459,260 B2 | 12/2008 | Chandhok et al. | |
| 7,488,568 B2 | 2/2009 | Iwai et al. | |
| 7,615,330 B2 | 11/2009 | Kamimura et al. | |
| 7,718,344 B2 | 5/2010 | Kamimura et al. | |
| 7,776,510 B2 | 8/2010 | Iwai et al. | |
| 8,227,624 B2 | 7/2012 | Nakayashiki et al. | |
| 8,318,403 B2 | 11/2012 | Ichikawa et al. | |
| 8,354,217 B2 | 1/2013 | Ichikawa et al. | |
| 8,367,298 B2 | 2/2013 | Ichikawa et al. | |
| 8,367,299 B2 | 2/2013 | Kawaue et al. | |
| 8,415,082 B2 | 4/2013 | Utsumi et al. | |
| 8,420,294 B2 | 4/2013 | Ichikawa et al. | |
| 8,507,575 B2 | 8/2013 | Matsumura et al. | |
| 2005/0079441 A1 | 4/2005 | Takahashi | |
| 2010/0081088 A1 | 4/2010 | Kawaue et al. | |
| 2010/0239978 A1 | 9/2010 | Wada et al. | |
| 2010/0248149 A1 | 9/2010 | Tsuchimura et al. | |
| 2010/0316951 A1 | 12/2010 | Ichikawa et al. | |
| 2012/0009521 A1 | 1/2012 | Kawaue et al. | |
| 2012/0135351 A1* | 5/2012 | Ichikawa et al. ........... 430/285.1 |
| 2012/0136155 A1 | 5/2012 | Makabe et al. | |

FOREIGN PATENT DOCUMENTS

| | | |
|---|---|---|
| CN | 102289149 A | 12/2011 |
| EP | 0164248 A2 | 12/1985 |

(Continued)

OTHER PUBLICATIONS

Machine translation of JP 2011-201860, published on Oct. 13, 2011.*
JP2011-201860 A, Oct. 13, 2011, Abstract Only, 1 page.
U.S. Appl. No. 14/012,577, filed Aug. 28, 2013, Photoacid Generator, Photoresist, Coated Substrate, and Method of Forming an Electronic Device, 31 Pages.

(Continued)

*Primary Examiner* — Anca Eoff
(74) *Attorney, Agent, or Firm* — Cantor Colburn LLP

(57) ABSTRACT

A photoacid generator has the formula (I):

$$\text{(I)}$$

wherein $R^1$, $R^2$, $R^3$, $L^1$, $L^2$, $L^3$ X, $Z^+$, a, b, c, d, p, q, and r, are defined herein. A photoresist comprises the photoacid generator, and a coated article comprises the photoresist. The photoresist can be used to form an electronic device.

12 Claims, No Drawings

(56) References Cited

FOREIGN PATENT DOCUMENTS

| | | |
|---|---|---|
| EP | 0783136 A2 | 7/1997 |
| EP | 0829766 A2 | 3/1998 |
| JP | 2011201866 A | 10/2011 |
| JP | 2011256390 A | 12/2011 |
| JP | 2014105166 A | 6/2014 |
| WO | 2011162408 A1 | 12/2011 |

OTHER PUBLICATIONS

U.S. Appl. No. 14/063,148, filed Oct. 25, 2013, "Photoacid Generator, Photoresist, Coated Substrate, and Method of Forming an Electronic Device"; 34 Pages.

U.S. Appl. No. 13/854,078, filed Mar. 30, 2013, "Acid Generators and Photoresists Comprising the Same"; 35 Pages.

Examination Report for TW Application No. 102137086; Date of Issue: Dec. 10, 2014; 3 pages.

Non-Final Office Action dated Jan. 13, 2015; U.S. Appl. No. 14/063,148, filed Oct. 25, 2013.

Non-Final Office Action dated Dec. 22, 2014; U.S. Appl. No. 14/012,577, filed Aug. 28, 2013.

Xie et al. "Isolation, Structure Identification and SAR Studies on Thiosugar Sulfonium Salts, Neosalaprinol and Neoponkoranol, as Potent α-Glucosidase Inhibitors" Bioorganic & Medicinal Chemistry 2011, 19, 2015-2022.

* cited by examiner

PHOTOACID GENERATOR, PHOTORESIST, COATED SUBSTRATE, AND METHOD OF FORMING AN ELECTRONIC DEVICE

BACKGROUND

Photoacid generators (PAG) used in photoresists are being designed to generate bulkier anions in order to suppress acid diffusion during post exposure bake (PEB), and hence provide higher resolution. However, this trend often causes higher defectivity as bulkier anions are hydrophobic, often containing lipophilic groups such as fluorinated groups, and may have poor solubility in developer and in rinse water.

One way to simultaneously achieve low diffusivity and good defectivity is to increase the size of PAG anion through attaching acid-cleavable groups. By doing so, the size of PAG anion can be large enough to suppress acid diffusion at the time of PEB and fragmented into smaller, highly polar species upon completion of the PEB process. The cleaved photoacid dissolves readily upon contacting with tetramethylammonium hydroxide (TMAH) developers which can reduce the number of defects. Acid cleavability can be obtained from the use of acetal or ketal linkages on the photogenerated anion moiety.

Ketal-protected polyhydroxy anions have been described in Japanese Patent No. JP2011201860(A), which are based on fluorinated adducts of a specific polyhydroxy tetrahydrofuranyl ring system. However, there remains a need for photoacid generators for 193 nm lithography, which exhibit improved resolution and defect control.

STATEMENT OF THE INVENTION

The above and other deficiencies of the prior art may be overcome by a photoacid generator comprising compound having the formula (I):

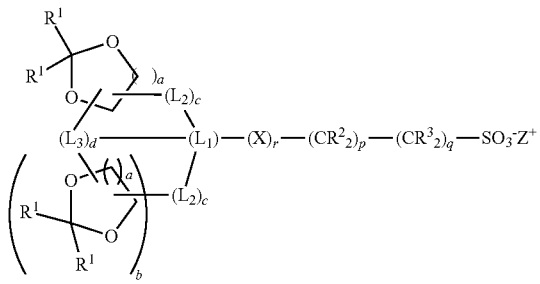

wherein each $R^1$ is independently H or a substituted or unsubstituted $C_{1-30}$ aliphatic group optionally bonded to an adjacent $R^1$, each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F, $L^1$, $L^2$ and $L^3$ are each independently a single bond, or a $C_{1-20}$ linking group optionally comprising a lactone group, wherein one or more of $L^1$, $L^2$ and $L^3$ optionally form a ring structure, and wherein one or more of $L^1$, $L^2$ and $L^3$ is optionally substituted with a polymerizable $C_{2-20}$ alpha-beta unsaturated organic group, X is an ether, ester, carbonate, amine, amide, urea, sulfate, sulfonate, or sulfonamide-containing group, $Z^+$ is an organic or inorganic cation, and each a is independently an integer of 0 to 12, b is an integer of 0 to 5, each c, d, and r is independently 0 or 1, and p is an integer of from 0 to 10, and q is an integer of from 1 to 10.

A photoresist composition comprises an acid-sensitive polymer, and the photoacid generator.

A coated substrate comprises: (a) a substrate having one or more layers to be patterned on a surface thereof; and (b) a layer of a photoresist composition over the one or more layers to be patterned.

A method of forming an electronic device comprises: (a) applying a layer of a photoresist composition on a substrate; (b) patternwise exposing the photoresist composition layer to activating radiation; and (c) developing the exposed photoresist composition layer to provide a resist relief image.

DETAILED DESCRIPTION

Disclosed herein is a novel series of photoacid generators (PAGs) having an anionic component with an acetal or ketal protected polyhydroxy group attached. Exposure and PEB processes for these novel PAGs produce small, developer-soluble and water-soluble acids. Photolysis of, for example, an onuim cation chromophore (e.g., triphenylsulfonium, abbreviated "TPS") paired with the anionic component produces the corresponding acid, and subsequent acid-catalyzed deprotection of the acetal or ketal groups reduces the size of the acid and generates water-solubilizing hydroxyl groups. The polyhydroxy group increases the size of the PAG anion and the increased number of polar hydroxyl groups capable of forming hydrogen bonds to one another. Both anion bulk and hydrogen bonding are believed to limit the diffusion of the PAG in the resist matrix during PEB. In this way, a PAG having slow diffusion during the net lithographic process can have low defectivity.

The acetal or ketal groups may generally form one or more ring structures such as a 5- or 6-membered ring, as part of a larger linear, cyclic, or polycyclic structure, which is connected to a fluorinated organic group having a sulfonate tail. Proximity of the sulfonate group to the fluorine substituents affects the net pKa of a sulfonic acid derived from the anionic component of the PAG.

The protected polyhydroxy group may include, for example, one or more sets of protected vicinal hydroxy units or 1,3-dihydroxy units, and may be a linear chain with protected hydroxy units off the main chain, or a cyclic or polycyclic structure with protected hydroxy units forming a pendant group attached to the ring, or forming a fused acetal or ketal-containing ring with the cyclic or polycyclic structure. The polycyclic structure may include an additional functional group, such as an ether, acetal, ketal, or lactone, or may include a reactive group such as a (meth)acrylate or other alpha beta unsaturated polymerizable group. As used herein, "(meth)acrylate" means acrylate or methacrylate or a combination comprising at least one of these polymerizable groups. Preferably, the polyhydroxy group is linear or cyclic or polycyclic with a lactone moiety incorporated into the cyclic structure.

Thus, the photoacid generator disclosed herein is a compound having the formula (I):

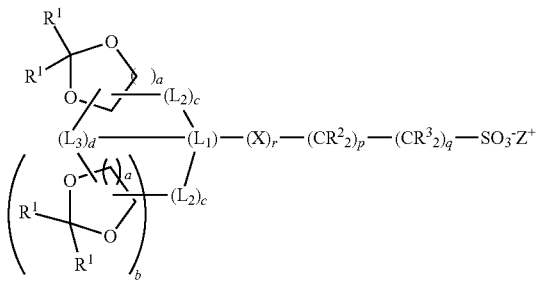

(I)

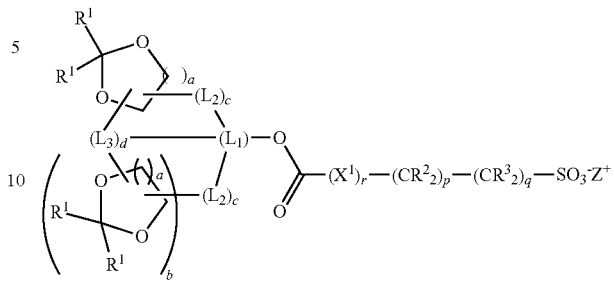

(I-a)

wherein each $R^1$ is independently H or a substituted or unsubstituted $C_{1-30}$ aliphatic group optionally bonded to an adjacent $R^1$. Preferably, each $R^1$ may be independently H, a $C_{1-20}$ alkyl group, a $C_{1-20}$ cycloalkyl group, or (where adjacent $R^1$ groups are bonded to one another) a $C_{1-20}$ alkylene or $C_{3-20}$ cycloalkylene group. Exemplary groups $R^1$ include hydrogen, methyl, ethyl, propyl, isopropyl, cyclopentyl, cyclohexyl, methylene, ethylene, propylene, trimethylene, 1,2-cyclopentylene, 1,2-cyclohexylene, and norboneneylene.

Also in Formula (I), each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F, p is an integer of from 0 to 10, and q is an integer of from 1 to 10. Preferably, one or more of $R^2$ and $R^3$ is F or $CF_3$. Also preferably, $R^2$ is H or a $C_{1-10}$ alkyl such as, for example, methyl, ethyl, propyl, isopropyl, butyl, isobutyl, cyclopentyl, or cyclohexyl; $R^3$ is F and/or $CF_3$; p is an integer of 1 to 6; and q is an integer of 1 to 4, preferably 1 to 3.

$L^1$, $L^2$ and $L^3$ in Formula (I) are each independently a single bond, or a $C_{1-20}$ linking group. Optionally, one or more of $L^1$, $L^2$ and $L^3$ form a ring structure, preferably with a lactone group incorporated into the ring. The lactone group is preferably part of a cyclic or polycyclic $C_{3-20}$ organic group. One or more of $L^1$, $L^2$ and $L^3$ are optionally substituted with a polymerizable $C_{2-20}$ alpha-beta unsaturated organic group. Exemplary such groups include, for example, substituted olefins, cyclic olefins, styrenes, and (meth)acrylates. Preferably, the polymerizable groups are (meth)acrylate groups.

Also in Formula (I), X is an ether, ester, carbonate, amine, amide, urea, sulfate, sulfonate, or sulfonamide-containing group. Preferably, X is —O—, —C(=O)—O—, —O—C(=O)—, —O—C(=O)—O—, —C(=O)—NR—, —NR—C(=O)—, —NR—C(=O)—NR—, —O—SO$_2$—, —SO$_2$—O—, —NR—SO$_2$—, or —SO$_2$—NR—, where R is H, a $C_{1-20}$ alkyl, a $C_{3-20}$ cycloalkyl, a $C_{6-20}$ aryl, or a $C_{7-20}$ aralkyl.

Each a in Formula (I) is independently an integer of 0 to 12, b is an integer of 0 to 5, each c, d, and r is independently 0 or 1. It will be appreciated that where c, d, or r is o, no corresponding spacer group L is present including a bond.

Preferably, the photoacid generator is a compound having the formula (I-a):

wherein each $R^1$, $R^2$, $R^3$, $L^1$, $L^2$, $L^3$, Z, a, b, c, d, r, p and q is as defined in Formula (I) and $X^1$ is —O—, —C(=O)—O—, —O—C(=O)—, —O—C(=O)—O—, —C(=O)—NR—, —NR—C(=O)—, —NR—C(=O)—NR—, —O—SO$_2$—, —SO$_2$—O—, —NR—SO$_2$—, or —SO$_2$—NR—, wherein R is H, a $C_{1-20}$ alkyl, a $C_{3-20}$ cycloalkyl, a $C_{6-20}$ aryl, or a $C_{7-20}$ aralkyl.

Preferably, the photoacid generator has the Formula (II):

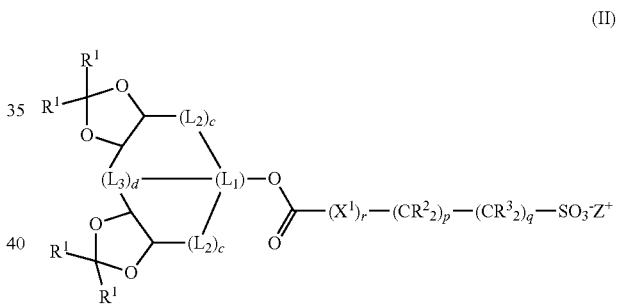

(II)

wherein $R^1$, $R^2$, $R^3$, $L_1$, $L_2$, $L_3$, Z, c, d, p, q, and r are as defined in formula (I).

Useful photoacid generators disclosed herein include those having the formulas (II-a) to (II-c):

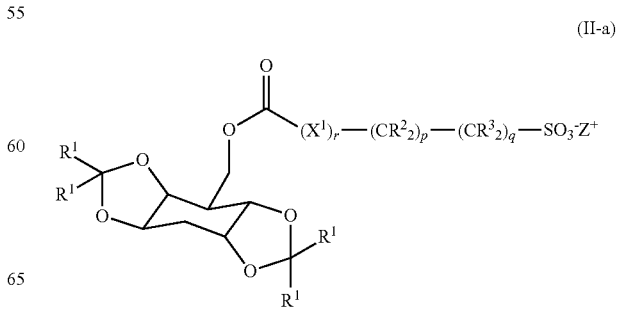

(II-a)

-continued

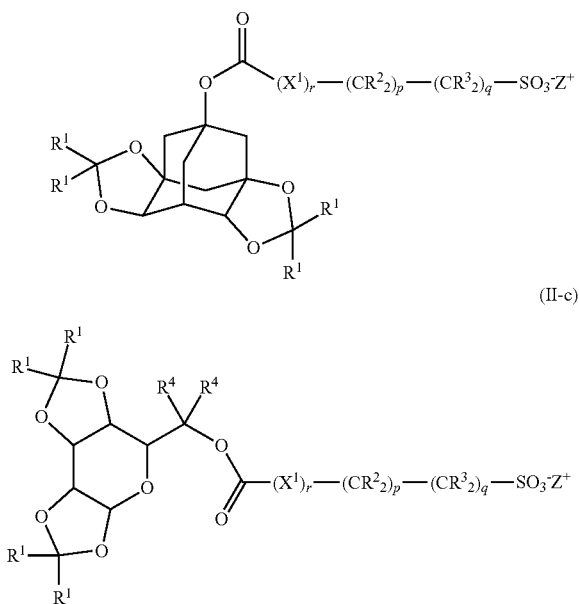

wherein $R^1$, $R^2$, $R^3$, Z, p, and q are as defined in formula (II), and $R^4$ in formula (II-c) is H, $C_{1-10}$ alkyl, or $C_{3-10}$ cycloalkyl.

The photoacid generator includes those having the formula (III):

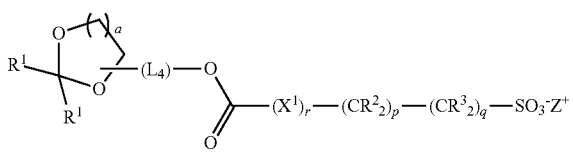

wherein $X^1$, $R^1$, $R^2$, $R^3$, Z, a, p, q, and r are as defined for formula (II), and $L_4$ is a $C_{1-20}$ lactone-containing linking group.

Exemplary lactone-containing photoacid generators include those having the formula (III-a) or (III-b):

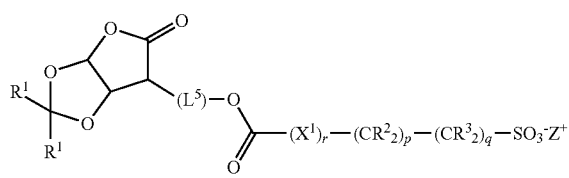

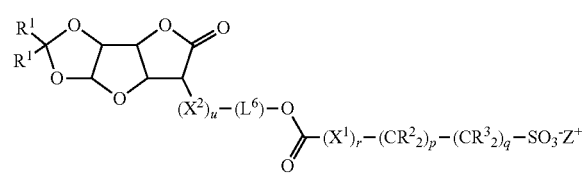

wherein X, $R^1$, $R^2$, $R^3$, Z, p, q, and r are as defined for formula (I), $L^5$ and $L^6$ are independently a single bond or a $C_{1-10}$ linking group, $X^1$ and $X2$ are independently O or NR where R is H or a $C_{1-6}$ alkyl, and u is 0 or 1.

Exemplary polymerizable photoacid generators include those having the formula (IV-a) or (IV-b):

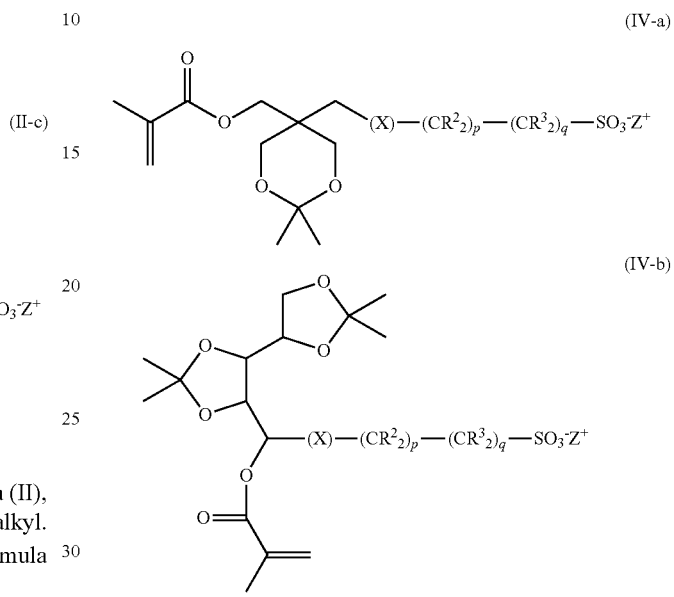

wherein X, $R^2$, $R^3$, $Z^+$, p and q are as defined for Formula (I).

As noted above, Z is a cation including an onium cation. Onium cations include cations of oxygen, iodine, or sulfur. Preferably, Z is a cation of the formula (V):

wherein each $R^5$ is independently substituted or unsubstituted $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{0-20}$ aryl, $C_{6-20}$ fluoroaryl, $C_{5-20}$ heteroaryl, $C_{7-20}$ aralkyl, $C_{7-20}$ fluoroaralkyl, $C_{6-20}$ heteroaralkyl, where each $R^5$ is separate or connected to the other group $R^5$ by a single bond, and Ar is a $C_{5-30}$ aromatic-containing group.

The onium cation is preferably a sulfonium cation of the formulas (VI), (VII), or (VIII):

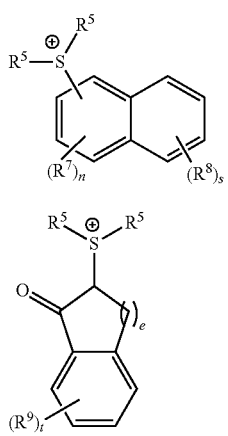

(VII)

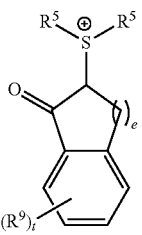

(VIII)

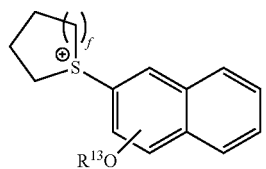

(XI)

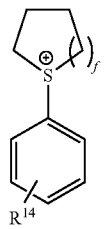

(XII)

wherein each $R^5$ is independently substituted or unsubstituted $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{6-20}$ aryl, $C_{6-20}$ fluoroaryl, $C_{5-20}$ heteroaryl, $C_{7-20}$ aralkyl, $C_{7-20}$ fluoroaralkyl, or $C_{6-20}$ heteroaralkyl, wherein each $R^5$ is separate or connected to the other $R^5$ by a single bond; $R^6$, $R^7$, $R^8$ and $R^9$ are each independently H, a halogen, $C_{1-20}$ alkyl, $C_{1-20}$ fluoroalkyl, $C_{1-20}$ alkoxy, $C_{1-20}$ fluoroalkoxy, $C_{1-20}$ thioalkoxy, $C_{1-20}$ fluorothioalkoxy, $C_{1-20}$ alkoxycarbonyl, $C_{1-20}$ fluoroalkoxycarbonyl, $C_{1-20}$ thioalkoxycarbonyl, $C_{1-20}$ fluorothioalkoxycarbonyl, $C_{3-20}$ cycloalkyl, $C_{3-20}$ fluorocycloalkyl, $C_{3-20}$ cycloalkoxy, $C_{3-20}$ fluorocycloalkoxy, $C_{2-20}$ alkenyl, $C_{2-20}$ fluoroalkenyl, $C_{6-20}$ aryl, $C_{6-20}$ fluoroaryl, $C_{6-20}$ aryloxy, $C_{6-20}$ fluoroaryloxy, $C_{5-20}$ heteroaryl, $C_{5-20}$ heteroaryloxy, $C_{5-20}$ heteroaryloxy, $C_{7-20}$ aralkyl, $C_{7-20}$ fluoroaralkyl, $C_{7-20}$ aralkyloxy $C_{7-20}$ fluoroaralkyloxy, or $C_{6-20}$ heteroaralkyl, or $C_{6-20}$ heteroaralkyloxy, wherein $R^6$, $R^7$, $R^8$ and $R^9$ are each independently unsubstituted or further substituted to include an acid-labile group, a base-labile group, or a base-soluble group, and m is an integer of 1 to 5, n is an integer of 0 to 3, s is an integer of 0 to 4, t is an integer of 0 to 4, and e is an integer of 0 to 4.

Preferably, Z is of the formula (IX), (X), (XI), or (XII):

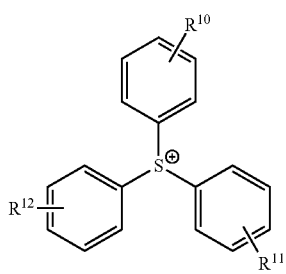

(IX)

(X)

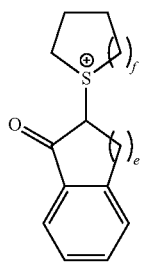

wherein $R^{10}$, $R^{11}$, $R^{12}$ and $R^{14}$ are independently H, a halogen, $C_{1-10}$ alkyl, $C_{1-10}$ fluoroalkyl, alkoxy, $C_{1-10}$ fluoroalkoxy, $C_{3-10}$ cycloalkyl, $C_{3-10}$ fluorocycloalkyl, $C_{3-10}$ cycloalkoxy, or $C_{3-10}$ fluorocycloalkoxy, $R^{13}$ is H, $C_{1-10}$ alkyl, $C_{1-10}$ fluoroalkyl, $C_{3-10}$ cycloalkyl, or $C_{3-10}$ fluorocycloalkyl, and e and f are each independently 1 or 2.

The photoacid generator may be prepared by, for example, the reaction between a polyol such as pentaerythritol, inositol, or g-gluconolactone, and an acetal or ketal such as 2,2-dimethoxypropane, 1,1-dimethoxycyclopentane, 1,1-dimethoxycyclohexane, 1,1-dimethoxyethane, or a vinyl ether such as methyl vinyl ether, ethyl vinyl ether, propyl vinyl ether, cyclohexyl vinyl ether, and the like, in the presence of catalytic amount of an acid such as p-toluenesulfonic acid or trifluoroacetic acid. Where an unreacted hydroxyl group remains, as for example where there is an odd number of hydroxyl groups on the polyol before treating with the acetal or ketal precursor, monoesterification is carried out with a fluorinated carboxylic acid moiety such as 3-bromo-3,3-difluoropropanoic acid chloride or 5-bromo-4,4,5,5-tetrafluoropentanoic acid chloride. The site of bromine substitution in the resultant compound may then be sulfinated with, for example, sodium dithionite in the presence of sodium hydrogen carbonate, followed by subsequent oxidation with an oxidizer such as hydrogen peroxide to give the corresponding sulfonate salt. A cation exchange reaction of the sulfonate salt intermediate with an onium cation such as triphenyl sulfonium bromide (TPS Br) can produce an onium sulfonate salt.

Optionally, O-acylation of a free hydroxyl group on the polyol after treatment with the ketal or acetal precursor under acidic conditions, with for example, (meth)acryloyl chloride, can produce an intermediate that can subsequently be esterified using the fluorinated carboxylic acid chloride on another free hydroxyl group, and ion exchanged to form the onium salt.

The photoacid generator may be formulated with or combined with a copolymer to form a photoresist. Where the combination is a polymer bound photoacid generator, an appropriately functionalized photoacid generator can be copolymerized with one or more monomers to form the copolymer, or the photoacid generator can be grafted onto the copolymer.

Copolymers useful for forming a photoresist in combination with the photoacid generator disclosed herein include acid deprotectable monomers, base base-soluble monomers, dissolution rate modifying monomers, and etch resistant monomers. Any such monomers or combinations of monomers suitable for forming, for example, a 193 nm photoresist polymer. Preferably, a combination of monomers is used, which include a (meth)acrylate monomer having an acid deprotectable base soluble group, a (meth)acrylate monomer having a lactone functional group, a (meth)acrylate monomer having a base-soluble group not identical to that of formula (I), or a combination comprising at least one of the foregoing monomers. Other monomers, such as (meth)acrylate monomer for improving adhesion, etch resistance, etc., may also be included.

Any acid-deprotectable monomer useful for forming a 193 nm photoresist polymer may be used. Exemplary acid-deprotectable monomers include, but are not limited to:

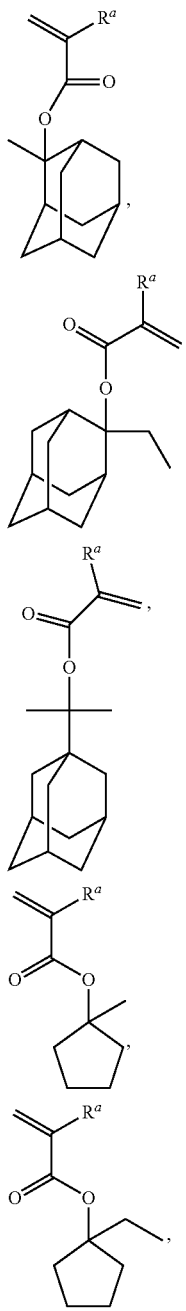

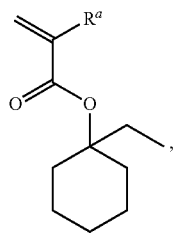

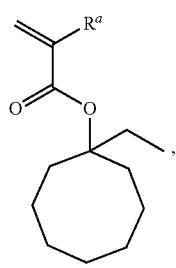

or a combination comprising at least one of the foregoing monomers, wherein $R^a$ is H, F, CN, $C_{1-10}$ alkyl, or $C_{1-10}$ fluoroalkyl.

Any lactone-containing monomer useful for forming a 193 nm photoresist polymer may be used. Exemplary such lactone-containing monomers include, but are not limited to:

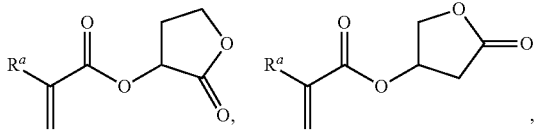

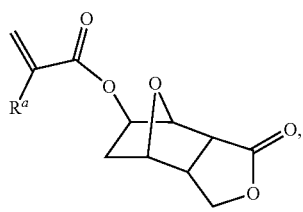

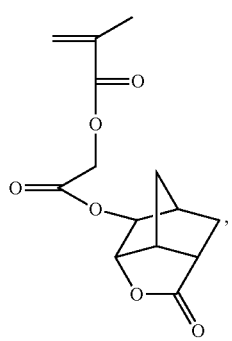

or a combination comprising at least one of the foregoing monomers, wherein $R^a$ is H, F, CN, $C_{1-10}$ alkyl, or $C_{1-10}$ fluoroalkyl.

Any base-soluble monomer useful for forming a 193 nm photoresist polymer may be used. Exemplary additional base-soluble (meth)acrylate monomers include, but are not limited to:

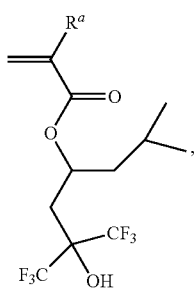

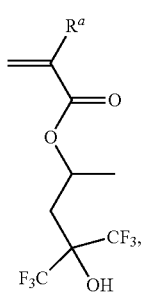

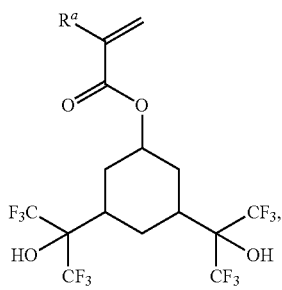

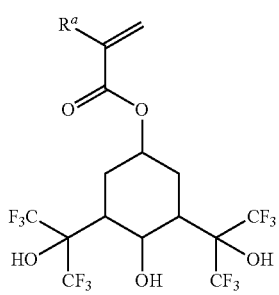

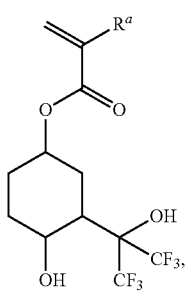

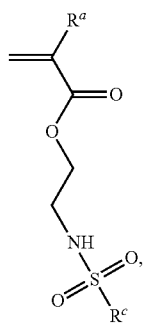

or a combination comprising at least one of the foregoing monomers, wherein $R^a$ is H, F, CN, $C_{1-10}$ alkyl, or $C_{1-10}$ fluoroalkyl, and $R^c$ is a $C_{1-4}$ perfluoroalkyl group.

The polymer may also include other monomers, including cage-structured monomers for enhancing etch resistance, with or without functional groups for improving adhesion. An exemplary adhesion-improving monomer includes:

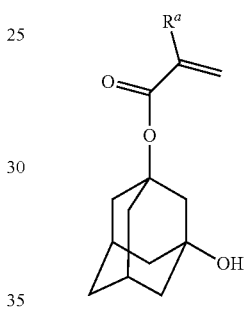

or a combination comprising the foregoing and at least one additional monomer, wherein $R^a$ is H, $C_{1-6}$ alkyl, or $CF_3$.

The photoacid generator is combined with the copolymer, either in admixture or by copolymerization, to form a photoresist. The photoresist optionally further includes a second acid sensitive polymer and/or photoacid generator, an amine or amide additive to adjust photospeed and/or acid diffusion, a solvent, and a surfactant.

The second acid-sensitive polymer may be any polymer suitable for formulating photoresists for use at 193 nm. Such acid-sensitive polymers include an acid sensitive polymer comprising acid sensitive groups and lactone-containing groups, where the acid sensitive group deprotects a base-soluble group on exposure to acid.

The photoresist composition may further an amine or amide compound, referred to herein as a quencher. Quenchers may more broadly include, for example, those based on hydroxides, carboxylates, amines, imines, and amides. In an embodiment, a useful quencher is an amine, an amide, or a combination comprising at least one of the foregoing. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBN), N-protected amines such as N-t-butylcarbonyl-1,1-bis(hydroxymethyl)-2-hydroxyethylamine (TBOC-TRIS), or ionic quenchers including quaternary alkyl ammonium salts such as tetrabutylammonium hydroxide (TBAH) or tetrabutyl ammonium lactate.

Other components of the photoresist may include solvents and surfactants.

Solvents generally suitable for dissolving, dispensing, and coating the components include anisole, alcohols including ethyl lactate, methyl 2-hydroxybutyrate (HBM), 1-methoxy-2-propanol (also referred to as propylene glycol methyl ether, PGME), and 1-ethoxy-2 propanol, esters including n-butylacetate, 1-methoxy-2-propyl acetate (also referred to as propylene glycol methyl ether acetate, PGMEA), methoxyethoxypropionate, ethoxyethoxypropionate, and gamma-butyrolactone, ketones including cyclohexanone and 2-heptanone, and a combination comprising at least one of the foregoing solvents.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoacid generator is present in the photoresist in an amount of 0.01 to 20 wt %, preferably 0.1 to 15 wt %, based on the total weight of solids. Where a polymer bound photoacid generator is used, the polymer bound photoacid generator as the corresponding monomer is present in the same amount. The copolymer may be present in an amount of 50 to 99 wt %, preferably 55 to 95 wt %, more preferably 60 to 90 wt %, and still more preferably 65 to 90 based on the total weight of solids. It will be understood that "polymer" used in this context of a component in a photoresist may mean only the copolymer disclosed herein, or a combination of the polymer with another polymer useful in a photoresist. A surfactant may be included in an amount of 0.01 to 5 wt %, preferably 0.1 to 4 wt %, and still more preferably 0.2 to 3 wt %, based on the total weight of solids. A quencher may be included in relatively small amounts of for example, from 0.03 to 5 wt % based on the total weight of solids. Other additives such as embedded barrier layer (EBL) materials for immersion lithography applications may be included in amounts of less than or equal to 30 wt %, preferably less than or equal to 20%, or more preferably less than or equal to 10%, based on the total weight of solids. The total solids content for the photoresist composition may be 0.5 to 50 wt %, preferably 1 to 45 wt %, more preferably 2 to 40 wt %, and still more preferably 5 to 35 wt %, based on the total weight of solids and solvent. It will be understood that the solids includes copolymer, photoacid generator, quencher, surfactant, and any optional additives, exclusive of solvent.

The photoresist disclosed herein may be used to form a film comprising the photoresist, where the film on the substrate constitutes a coated substrate. Such a coated substrate includes: (a) a substrate having one or more layers to be patterned on a surface thereof; and (b) a layer of the photoresist composition over the one or more layers to be patterned. Preferably, patterning is carried out using ultraviolet radiation at wavelength of less than 248 nm, and in particular, at 193 nm. The patternable film thus comprises the photoacid generator of formula (I). A method of forming an electronic device therefore includes: (a) applying a layer of a photoresist composition on a substrate; (b) patternwise exposing the photoresist composition layer to activating radiation; and (c) developing the exposed photoresist composition layer to provide a resist relief image. Preferably, the radiation is 193 nm or 248 nm radiation.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 200 mm, 300 mm, or larger in diameter, or other dimensions useful for wafer fabrication production.

The invention is further illustrated by the following examples. All compounds and reagents used herein are available commercially except where a procedure is provided below.

Photoacid generator PAG-A1 was prepared by the multi-step synthesis detailed in Scheme 1 and the following paragraphs.

Scheme 1:

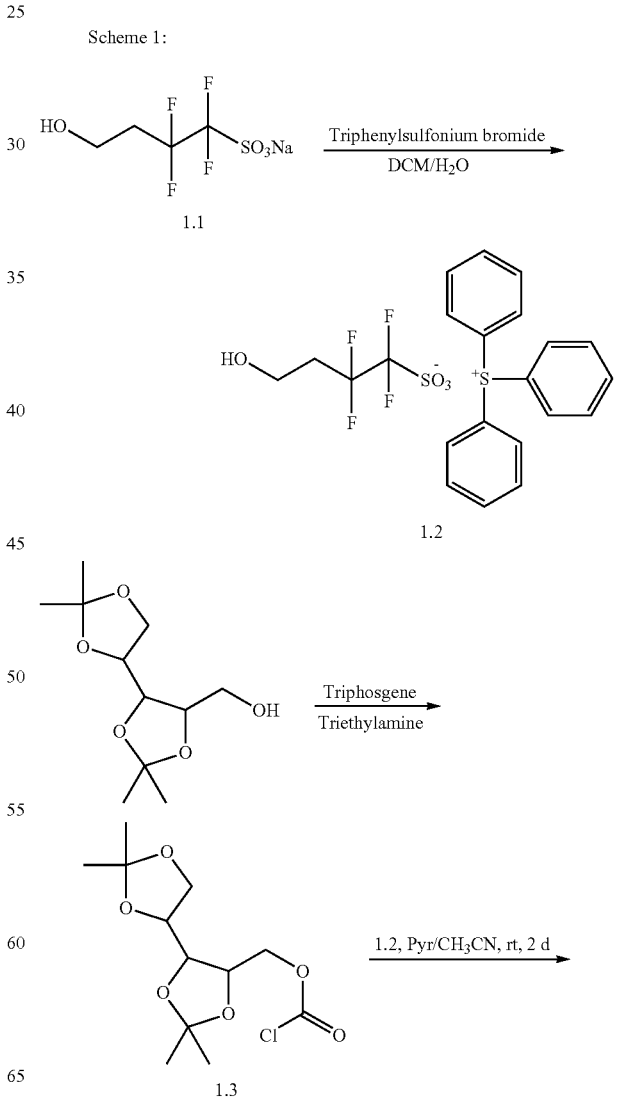

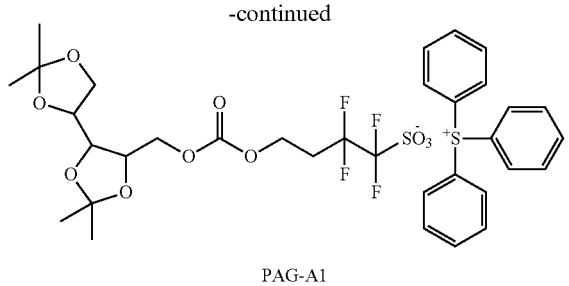

PAG-A1

Triphenylsulfonium 1,1,2,2-tetrafluoro-4-hydroxybutane-1-sulfonate (1.2) was prepared according to the following procedure. Triphenylsulfonium bromide (TPSBr) (52.70 g, 0.153 mol) and sodium 1,1,2,2-tetrafluoro-4-hydroxybutane-1-sulfonate (1.1) (40 g, 0.16 mol) were dissolved in 380 mL dichloromethane and 20 mL deionized water, and stirred at room temperature for 16 h. under nitrogen. At this time the organic phase of the resulting biphasic mixture was separated. The organic phase was gravity filtered through filter paper to remove traces of water. The solvent was then removed by rotary evaporation to yield crude product (1.2) which was used without further purification. $^1$H NMR (CDCl$_3$, 300 MHz): δ 1.89 (bs, 1H), 2.63 (m, 2H), 3.91 (t, 2H), 7.75 (m, 15H). $^{19}$F NMR: δ-118.15, -111.13.

((2,2,2',2'-Tetramethyl-4,4'-bi(1,3-dioxolan)-5-yl)methyl carbonochloridate) (1.3) was prepared according to the following procedure. 2,3,4,5-Di-O-isopropylidene-D-xylitol (15.00 g, 0.07 mol) was dissolved in 100 mL anhydrous dichloromethane followed by addition of triethylamine (10.7 g, 0.106 mol) under nitrogen. The rapidly stirred solution was cooled on an ice bath. Triphosgene (10.43 g. 0.035 mol) dissolved in dichloromethane added dropwise over one hour. The reaction was stirred at 0° C. under nitrogen for 3 h. The reaction mixture was filtered and the filtrate was washed with deionized H$_2$O (5×100 mL), dried on MgSO$_4$, and the solvent removed on the rotary evaporator at 30° C. to give a clear oil. This was dried under vacuum at ambient temperature to give 19 g (91% yield) of oily product (1.3). $^1$H NMR (CDCl$_3$, 300 MHz): δ 1.36 (s, 3H), 1.42 (bs, 9H), 3.89 (m, 1H), 3.95 (m, 1H), 4.07 (m, 1H), 4.22 (m, 2H), 4.32 (m, 1H), 4.53 (m, 1H).

(Triphenylsulfonium 1,1,2,2-tetrafluoro-5-(((2,2,2',2'-tetramethyl-4,4'-bi(1,3-dioxolan)-5-yl)methoxy)carbonyloxy)pentane-1-sulfonate (PAG-A1; abbreviated TPS CIPX TFBS) was prepared according to the following procedure. Triphenylsulfonium 1,1,2,2-tetrafluoro-4-hydroxybutane-1-sulfonate (1.2, 20.42 g, 0.042 mol) was dissolved in 200 mL anhydrous acetonitrile followed by addition of anhydrous pyridine (7.27 g, 0.092 mol) under nitrogen. The rapidly stirred solution was cooled on an ice bath. IPXOCOCl ((2,2,2',2'-tetramethyl-4,4'-bi(1,3-dioxolan)-5-yl)methyl carbonochloridate) (1.3, 14.80 g, 0.05 mol) dissolved in 100 mL anhydrous acetonitrile was added dropwise over 30 min. The reaction was stirred at room temperature under nitrogen for 2 days. Solvent was removed on the rotary evaporator at 30° C., and the residual oily material was dissolved in dichloromethane (200 mL), washed with H$_2$O (8×100 mL), filtered through heavy pleated paper and the solvent removed on the rotary evaporator at 30° C. to provide a gummy oily material. The oily material was redissolved in dichloromethane (100 mL) and the resulting solution was poured slowly into 2 L of rapidly stirred methyl tert-butyl ether (MTBE). The resulting white suspension was stirred 15 min., let stand 15 min. to allow the precipitate to congeal, the supernatant was decanted and the congealed oily residue was dried under vacuum to yield 20 g (63% yield) of PAG-A1 as a thick oily material. $^1$H NMR (CDCl$_3$, 300 MHz): δ 1.36 (s, 3H), 1.42 (bs, 9H), 2.79 (m, 2H), 3.88 (t, 1H), 3.93 (m, 1H), 4.07 (t, 1H), 4.18 (m, 3H), 4.34 (m, 1H), 4.43 (t, 2H). $^{19}$F NMR: δ-118.76, -112.64.

Photoacid generator PAG-A2 was prepared by a multi-step synthesis as outlined in Scheme 2 and the following paragraphs.

Scheme 2

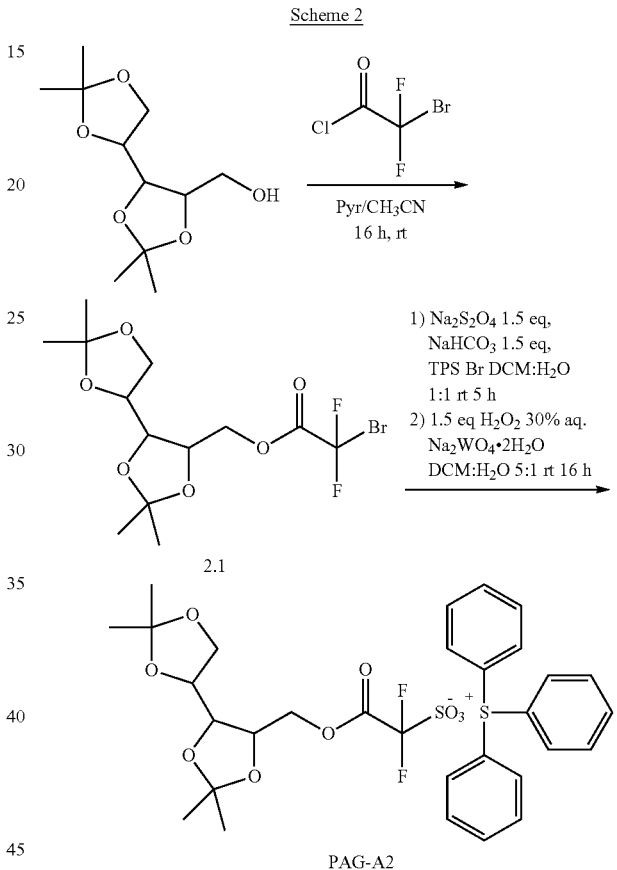

PAG-A2

(((4S,4'R,5S)-2,2,2',2'-tetramethyl-4,4'-bi(1,3-dioxolan)-5-yl)methyl-2-bromo-2,2-difluoroacetate) (2.1): 2,3,4,5-Di-O-isopropylidene-D-xylitol (20.00 g, 0.094 mol) was dissolved in 250 mL anhydrous acetonitrile followed by addition of anhydrous pyridine (8.4 g, 0.11 mol) under nitrogen. The rapidly stirred solution was cooled on an ice bath. 2-Bromo-2,2-difluoroacetyl chloride (20.00 g, 0.1 mol) added dropwise over 15 min. The reaction was stirred at room temperature under nitrogen for 16 h. Solvent was removed on the rotary evaporator at 30° C., and the residual oily material was dissolved in dichloromethane (200 mL), washed with H$_2$O (100 mL), 200 mL 1 N HCl, followed by 200 mL saturated aqueous NaHCO$_3$, dried on MgSO$_4$, and the solvent removed on the rotary evaporator at 30° C. to give a clear oil. This was dried under vacuum at ambient temperature to give 34.8 g (95% yield) of oily product (2.1). $^1$H NMR (CDCl$_3$, 300 MHz): δ 1.36 (s, 3H), 1.41 (bs, 9H), 3.9 (m, 1H), C (m, 1H), 4.07 (t, 1H), 4.24 (m, 2H), 4.35 (m, 1H), 4.57 (m, 1H). $^{19}$F NMR: δ-61.23.

Triphenylsulfonium 1,1-difluoro-2-oxo-2-(((4S,4'R,5S)-2,2,2',2'-tetramethyl-4,4'-bi(1,3-dioxolan)-5-yl)methoxy)ethanesulfonate (PAG-A2) was prepared as follows. Compound 2.1 (30 g, 0.077 mol) and TPSBr (triphenylsulfonium bromide) (29.70 g, 0.86 mol) were dissolved in 300 mL of rapidly stirred dichloromethane, under nitrogen. To this solution was slowly added sodium dithionite (20.17 g, 0.116 mol) and sodium bicarbonate (9.74 g, 0.116 mol) dissolved in 300 mL deionized water. Gas evolution was observed, both during the preparation of the aqueous salt solution and during the addition. The reaction was rapidly stirred under nitrogen for 5 h at ambient temperature. Stirring was stopped and the reaction containing crude triphenylsulfonium 1,1-difluoro-2-oxo-2-(((4S,4'R,5S)-2,2,2',2'-tetramethyl-4,4'-bi(1,3-dioxolan)-5-yl)methoxy)ethane sulfinate was allowed to separate. The aqueous phase was discarded and organic layer was washed with deionized water (3×200 mL) to a pH of 5-6. Deionized water (100 mL) was added to the washed organic phase and the resulting biphasic solution was stirred rapidly while Na$_2$WO$_4$.2H$_2$O (50 mg) was added, followed by 30% w/w aqueous hydrogen peroxide (1.06 g, 1.5 eq.). The reaction was stirred for 16 h. at ambient temperature, followed by separation of the phases. The aqueous phase was extracted with dichloromethane (150 mL), and treated with 14 g sodium bisulfate then discarded. The organic layer was evaporated and further purified by passing over silica plug, which was then eluted with 1 L dichloromethane followed by 1 L 2:1 (v/v) dichloromethane/acetone. These fractions were evaporated and redissolved in dichloromethane (500 mL), washed with water (8×200 mL), gravity filtered through heavy pleated filter paper, and solvent removed on the rotary evaporator at 30° C. to give a gummy oil. The oily material was redissolved in dichloromethane (100 mL) and the resulting solution was poured slowly into 2 L of rapidly stirred methyl tert-butyl ether (MTBE). The white suspension was stirred 15 min., let stand 15 min., MTBE was decanted and oily residue was dried under vacuum to yield 15 g (30% yield) of PAG-A2 as a thick oily material. $^1$H NMR (CDCl$_3$, 300 MHz): δ 1.35 (s, 3H), 1.41 (bs, 9H), 3.89 (t, 1H), 4.07 (m, 2H), 4.24 (m, 2H), 4.42 (m, 2H). $^{19}$F NMR: δ-110.11.

Photoacid generator PAG-A3 was prepared by the multi-step synthesis detailed in Scheme 3 and the following paragraphs.

Scheme 3

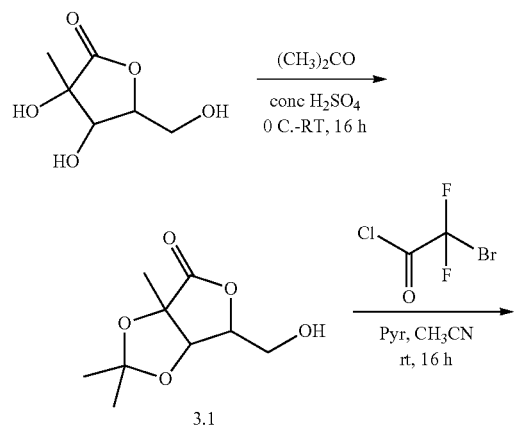

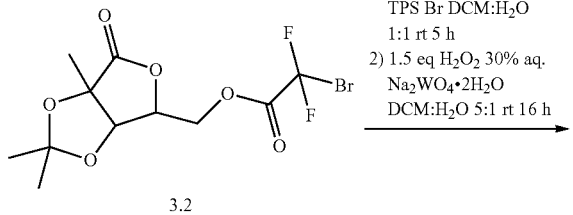

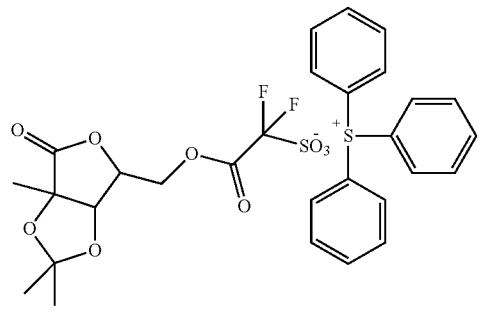

PAG-A3

2-C-Methyl-D-ribono-1,4-lactone (50 g, 0.31 mol) was dissolved in acetone (1 L) and the solution was cooled using an ice bath followed by slow dropwise addition of conc. H$_2$SO$_4$ (20 mL). The reaction mixture was stirred at room temperature under nitrogen for 16 h. Solid Na$_2$CO$_3$ was added slowly to a pH of 6. The resultant mixture was filtered to remove inorganic salts and filtrate was evaporated. The oily residue was redissolved in dichloromethane and further purified by passing through a silica plug to yield 55 g of product (3.1) as off-white solids (89% yield). $^1$H NMR (CDCl$_3$, 300 MHz): δ 1.43 (s, 3H), 1.45 (s, 3H), 1.66 (s, 3H), 2.07 (s, 1H), 3.85 (d, 1H), 3.97 (d, 1H), 4.53 (s, 2H).

((2,2,6a-trimethyl-6-oxotetrahydrofuro[3,4-d][1,3]dioxol-4-yl)methyl 2-bromo-2,2-difluoro acetate) (3.2) 2,3-O-Isopropylidene-2-C-methyl-D-ribonic-γ-lactone (3.1, 20.00 g, 0.099 mol) was dissolved in 250 mL anhydrous acetonitrile followed by addition of anhydrous pyridine (8.6 g, 0.11 mol) under nitrogen. The rapidly stirred solution was cooled on an ice bath. 2-Bromo-2,2-difluoroacetyl chloride (21.05 g, 0.11 mol) added dropwise over 15 min. The reaction was stirred at room temperature under nitrogen for 16 h. Solvent was removed on the rotary evaporator at 30° C., and the residual oily material was dissolved in dichloromethane (200 mL), and washed with H$_2$O (100 mL) followed by 200 mL 1 N HCl, then 200 mL saturated aqueous NaHCO$_3$, and dried on MgSO$_4$ and the solvent removed by rotary evaporation to give a clear oil. The clear oil was dried under vacuum at ambient temperature to yield 35 g (98%) of 3.2 as an oil. $^1$H NMR (CDCl$_3$, 300 MHz): δ 1.45 (s, 6H), 1.67 (s, 3H), 4.45 (m, 2H), 4.70 (m, 2H). $^{19}$F NMR: δ-110.11.

(Triphenylsulfonium 1,1-difluoro-2-oxo-2-((2,2,6a-trimethyl-6-oxotetrahydrofuro[3,4-d][1,3]dioxol-4-yl)methoxy)ethanesulfonate (PAG-3) was prepared according to the following procedure. Compound 3.2 (24 g, 0.067 mol) and TPSBr (triphenylsulfonium bromide) (26.0 g, 0.76 mol) were dissolved in 250 mL of dichloromethane, under nitrogen and with rapid stirring. To this solution, sodium dithionite (18.0 g, 0.1 mol), and sodium bicarbonate (8.4 g, 0.1 mol) dissolved in 250 mL deionized water, were both added. Gas evolution was observed during both preparation of the aqueous salt solution and the addition. The reaction was rapidly stirred under nitrogen for 5 h. at ambient temperature, and the reaction containing crude triphenylsulfonium 1,1-difluoro-2-oxo-2-((2,2,6a-trimethyl-6-oxotetrahydrofuro[3,4-d][1,3]dioxol-4-yl)methoxy)ethanesulfinate was allowed to separate.

The aqueous phase was discarded and organic layer was washed with deionized water (3×200 mL) to a pH of 5-6. Additional deionized water (100 mL) was added to the organic phase, and to the rapidly stirred biphasic solution, $Na_2WO_4 \cdot 2H_2O$ (50 mg) was added, followed by hydrogen peroxide, 30% (w/w) in water (7.0 g, 1.5 eq.). The reaction was stirred for 16 h. at ambient temperature, and the phases separated. The aqueous phase was extracted with 150 mL dichloromethane, and were treated with 15 g sodium bisulfate and discarded. The organic layer was evaporated and redissolved in dichloromethane (500 mL), washed with deionized water (8×200 mL), gravity filtered through heavy pleated paper, and solvent removed on the rotary evaporator at 30° C. to provide a gummy oil. The oily material was redissolved in dichloromethane (100 mL) and the resulting solution was poured slowly into 2 L of rapidly stirred methyl tert-butyl ether (MTBE). The white suspension was stirred 15 min., let stand 15 min., MTBE was decanted and oily residue was dried under high vacuum to yield 25 g (60% yield) of PAG-A3 as thick oil. $^1$H NMR (CDCl$_3$, 300 MHz): δ 1.40 (s, 3H), 1.42 (s, 3H), 1.72 (s, 3H), 4.44 (d, 1H), 4.54 (d, 1H), 4.69 (s, 2H). $^{19}$F NMR: δ-111.49, -110.65, -110.14, -109.30.

Photoacid generator PAG-A4 was prepared by the multi-step synthesis detailed in Scheme 4 and the following paragraphs.

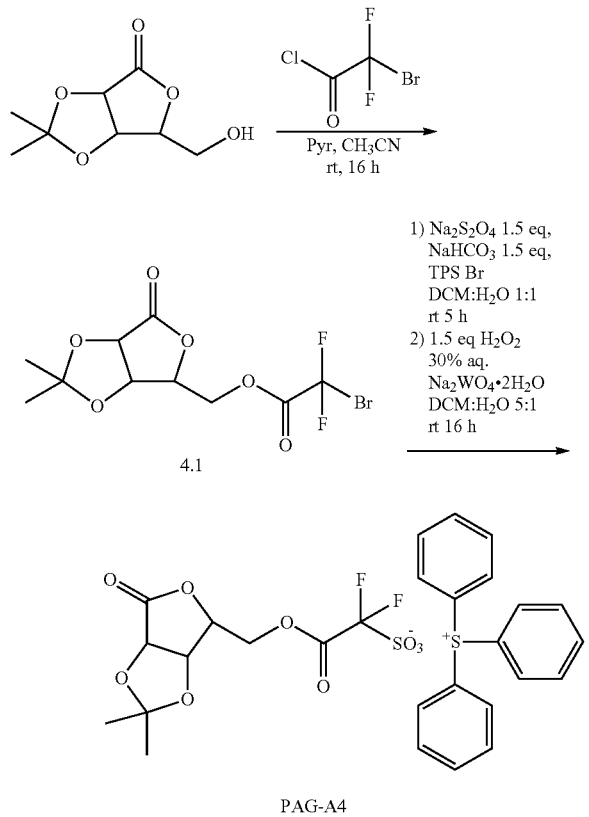

Scheme 4

PAG-A4

((2,2-dimethyl-6-oxotetrahydrofuro[3,4-d][1,3]dioxol-4-yl)methyl 2-bromo-2,2-difluoro acetate) (4.1) was prepared according the following procedure. 2,3-O-Isopropylidene-D-ribonic-γ-lactone (25.00 g, 0.133 mol) was dissolved in 250 mL anhydrous acetonitrile followed by addition of anhydrous pyridine (11.57 g, 0.146 mol) under nitrogen. The rapidly stirred solution was cooled on an ice bath. 2-Bromo-2,2-difluoroacetyl chloride (28.20 g, 0.146 mol) added dropwise over 15 min. The reaction was stirred at room temperature under nitrogen for 16 h. The solvent was removed by rotary evaporation, and the residual oily material was dissolved in dichloromethane (200 mL), and washed with H$_2$O (100 mL), 200 mL 1 N HCl, and 200 mL saturated aqueous NaHCO$_3$, and dried on MgSO$_4$, and the solvent removed by rotary evaporation to yield a clear oil. This was dried under vacuum at ambient temperature to give 45 g (98% yield) of oily product (4.1). $^1$H NMR (CDCl$_3$, 300 MHz): δ 1.42 (s, 3H), 1.50 (s, 3H), 4.49 (d, 1H), 4.75 (m, 2H), 4.86 (s, 2H). $^{19}$F NMR: δ-61.79.

Triphenylsulfonium 1,1-difluoro-2-oxo-2-((2,2-dimethyl-6-oxotetrahydrofuro[3,4-d][1,3]dioxol-4-yl)methoxy) ethanesulfonate (PAG-A4) was prepared as follows. Compound 4.1, (45 g, 0.13 mol) and TPSBr (triphenylsulfonium bromide) (50.4 g, 0.147 mol) were dissolved in 400 mL dichloromethane, under nitrogen with rapid stirring. To this solution was slowly added sodium dithionite (35.0 g, 0.2 mol) and sodium bicarbonate (17.0 g, 0.2 mol) dissolved in 400 mL deionized water. Gas evolution was observed, both during the preparation of the aqueous salt solution and during the addition. The reaction was rapidly stirred under nitrogen for 5 h at ambient temperature. Stirring was stopped and the reaction containing crude triphenylsulfonium 1,1-difluoro-2-oxo-2-((2,2-dimethyl-6-oxotetrahydrofuro[3,4-d][1,3]dioxol-4-yl)methoxy)ethanesulfinate was allowed to separate. The aqueous phase was discarded and organic layer was washed with deionized water (3×200 mL) to a pH of 5-6. Deionized water (100 mL) was added to the organic phase and the biphasic solution was stirred rapidly while Na$_2$WO$_4 \cdot$2H$_2$O (50 mg) was added, followed by hydrogen peroxide, 30% w/w in water (17.6 g, 1.5 eq.). The reaction was stirred for 16 h. at ambient temperature. Stirring was stopped and the phases separated. The aqueous phase was extracted with 150 mL dichloromethane, treated with 25 g sodium bisulfate and discarded. The organic layer was evaporated and redissolved in dichloromethane (500 mL), washed with deionized water (8×200 mL), gravity filtered through heavy pleated paper, and the solvent removed by rotary evaporation to give a gummy oil. The oily material was redissolved in dichloromethane (100 mL) and the resulting solution was poured slowly into 2 L of rapidly stirred methyl tert-butyl ether (MTBE). The white suspension was stirred 15 min., let stand 15 min., MTBE was decanted and oily residue was dried under high vacuum to yield 40 g (51% yield) of PAG-A4 as a white solid. $^1$H NMR (CDCl$_3$, 300 MHz): δ 1.33 (s, 3H), 1.44 (s, 3H), 4.53 (s, 2H), 4.78 (s, 1H), 4.90 (d, 1H), 5.40 (d, 1H). $^{19}$F NMR: δ-110.51.

Photoacid generator PAG-5 was prepared by the multi-step synthesis detailed in Scheme 5 and the following paragraphs.

Scheme 5

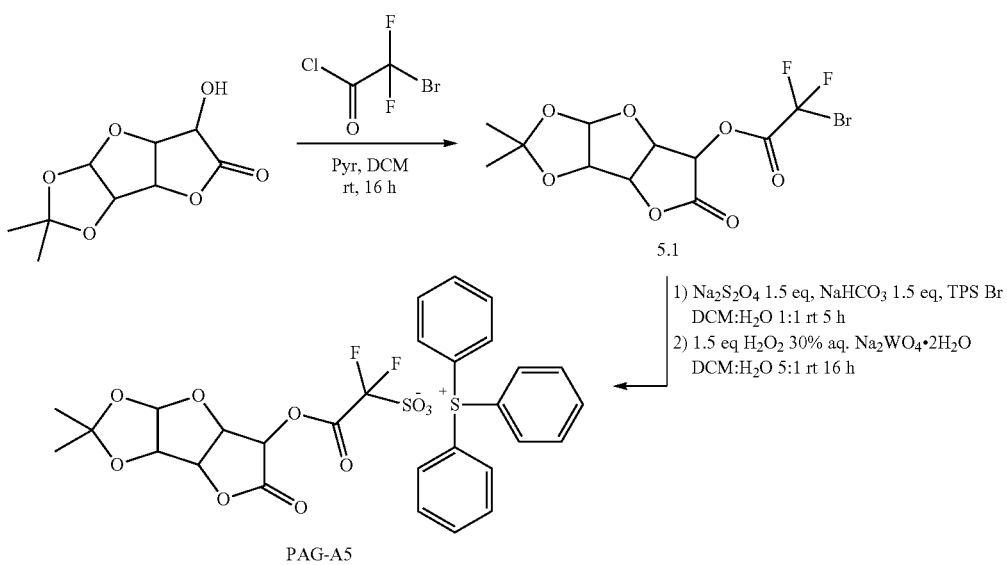

PAG-A5

1,2-O-Isopropylidene-α-D-glucofuranurono-6,3-lactone (20.00 g, 0.09 mol) was dissolved in 250 mL anhydrous dichloromethane followed by addition of anhydrous pyridine (8.2 g, 0.1 mol) under nitrogen. The rapidly stirred solution was cooled to below 10° C. 2-Bromo-2,2-difluoroacetyl chloride (19.70 g, 0.1 mol) added dropwise over 15 min. The reaction was stirred at room temperature under nitrogen for 16 h. Solvent was removed on the rotary evaporator at 30° C., and the residual oily material was dissolved in dichloromethane (200 mL), washed with $H_2O$ (100 mL), 200 mL 1 N HCl, and 200 mL saturated aqueous $NaHCO_3$, dried over $MgSO_4$, and the solvent removed by rotary evaporation to give a clear oil. This was dried under vacuum at ambient temperature to give 34 g (98% yield) of oily product (5.1). $^1$H NMR ($CDCl_3$, 300 MHz): δ 1.36 (s, 3H), 1.53 (s, 3H), 4.87 (s, 1H), 4.96 (s, 1H), 5.15 (s, 1H), 5.56 (s, 1H), 6.05 (s, 1H). $^{19}$F NMR: δ-61.71.

Next, compound 5.1 (34 g, 0.13 mol) and TPSBr (triphenylsulfonium bromide) (35 g, 0.1 mol) were dissolved in 300 mL dichloromethane, under nitrogen with rapid stirring. A solution of sodium dithionite (24.0 g, 0.138 mol) and sodium bicarbonate (11.48 g, 0.137 mol) were dissolved in 300 mL deionized water was slowly added. Gas evolution was observed, both during the preparation of the aqueous salt solution and during the addition. The reaction was rapidly stirred under nitrogen for 5 h. at ambient temperature, and the reaction containing crude product was allowed to separate. The aqueous phase was discarded and the organic layer was washed with deionized water (3×200 mL) to a pH of 5-6. To the washed organic phase, deionized water (100 mL) was added. To the rapidly stirred biphasic solution was added $Na_2WO_4 \cdot 2H_2O$ (50 mg), followed by hydrogen peroxide, 30% (w/w) in water (15 g, 1.5 eq.). The reaction was stirred for 16 h. at ambient temperature and the phases separated. The aqueous phase was extracted with 150 mL dichloromethane, treated with 15 g sodium bisulfate and discarded. The organic layer was evaporated and redissolved in dichloromethane (500 mL), washed with deionized water (8×200 mL), gravity filtered through heavy pleated paper, and solvent removed by rotary evaporation to yield a gummy oil. The oily material was redissolved in dichloromethane (100 mL) and the resulting solution was poured slowly into 2 L of rapidly stirred methyl tert-butyl ether (MTBE). The white suspension was stirred 15 min., let stand 15 min. to coagulate the flocculent solids, the MTBE was decanted and the white solid dried under high vacuum to yield 13 g (22% yield) PAG-A5 as white solids. $^1$H NMR (($CD_3$)$_2$CO, 300 MHz): δ 1.27 (s, 3H), 1.42 (s, 3H), 4.84 (s, 1H), 5.04 (s, 1H), 5.10 (s, 1H), 5.85 (s, 1H), 5.98 (s, 1H), 7.87 (m, 15H). $^{19}$F NMR: δ-109.69.

Acid diffusion measurements were determined by the following procedure. An acid detector layer formulation was prepared by combining an acid cleavable polymer A1 (2-adamantyl-2-propyl methacrylate/alpha-(gammabutyrolactone) methacrylate/1-hydroxyadamantyl-3-methacrylate terpolymers, 30/50/20 molar ratio, Mw=10K g/mol), shown below (5.981 wt % of total formulation):

polymer A1

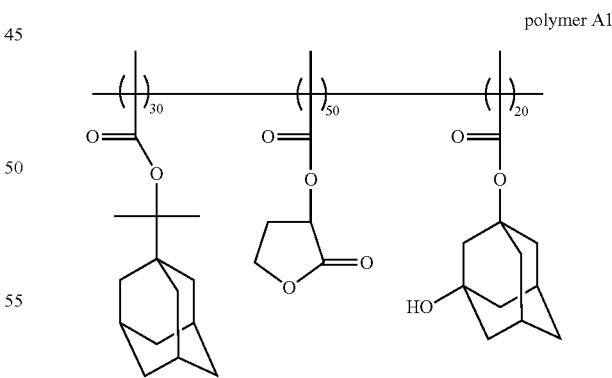

and tert-butyl 4-hydroxypiperidine-1-carboxylate as a quencher (0.019 wt % of total formulation) in a 50/50 (w/w) mixture of propylene glycol methyl ether acetate (PGMEA) and methyl 2-hydroxyisobutyrate (HBM). Separately, an acid source layer formulation was prepared by combining a t-butylacrylate/methacrylic acid 70/30 mole percent, for 100 mol percent of monomers) copolymer (0.891% of solution) and the PAG (153.40 μmol/g based on the total formulation) in an 80/20 (w/w) mixture of 2-methyl-1-butanol and decane. The acid detector layer formulation and acid source layer solutions were each filtered separately using a 0.2 µm polytetrafluoroethylene (PTFE) syringe filter.

The substrate (Si wafer, 200 mm) was coated with AR77 antireflective coating (available Rohm & Haas) and baked at 205° C. for 60 seconds to form an antireflective layer of 84 nm thickness, and 120 nm of the acid detector layer formulation was coated on the antireflective layer with baking at 110° C. for 60 seconds. The acid source layer formulation was then coated on the acid detector layer and baked at 90° C. for 60 seconds. All coating processes were carried out on a TEL ACT 8 coating track manufactured by Tokyo Electron.

The wafer so coated was then open frame exposed over 100 dose increments (separate doses) starting from an initial dose of 1 mJ/cm² at increments of 0.2 mJ/cm² using a 193 exposure tool (/1100 Stepper manufactured by ASML) and annular illumination. The wafer was post exposure baked (PEB) at 110° C. for 60 seconds or 120° C. for 60 seconds. During the PEB step the acid released during exposure in the acid source layer diffused into the acid detector layer causing deprotection of the acid labile group of the polymer of the acid detector layer After PEB, the pattern was developed using 0.26N aqueous tetramethylammonium hydroxide (TMAH) solution. The film thickness difference between the unexposed regions and exposed regions of the pattern is the total film loss ($\Delta L$). The greater the film thickness loss in the exposed region, the greater the acid diffusion.

The diffusivity of the PAG, D, is defined by Fick's law of diffusion (equation 1):

$$D = (\Delta L/2 * \text{erfc } E_{th}/E)2/t_{PEB} \quad \text{(equation 1)}$$

where $\Delta L$ is the difference in thickness between the exposed and unexposed areas (also referred to herein as the film thickness loss), $t_{PEB}$ is the PEB time, erfc is the error function complement, $E_{th}$ is the exposure dose (in mJ/cm²) at which film thickness loss was observed for the first time, and E is the exposure dose (in mJ/cm²). Once the diffusivity was determined, the diffusion length, DL, was then calculated using equation 2:

$$DL = 2*(D*t_{PEB})^{1/2} \quad \text{(equation 2)}$$

The diffusion length data for the exemplary and comparative PAGS are summarized in Table 1, below.

TABLE 1

| PAG | Anion structure | PAG acid diffusion length (nm) at PEB = 110° C./60 sec | PAG acid diffusion length (nm) at PEB = 120° C./60 sec |
|---|---|---|---|
| Triphenylsulfonium perfluorobutanesulfonate (TPSPFBuS) | [structure] | 38.6 | 74.6 |
| PAG-A1 | [structure] | 25.50 | 59.99 |
| PAG-A2 | [structure] | 22.62 | 44.97 |

As can be seen in Table 1, the acid diffusion measurements indicate a shorter acid diffusion length for both PAG-A1 and PAG-A2 at PEB temperatures of both 110 and 120° C. when compared with the comparative PAG (TPSPFBuS).

The photoacid generators were evaluated lithographically according to the following procedure. Photoresists were formulated using the components and proportions shown in Table 2. The commercial photoresist polymer A2 was used in all examples. Polymer A2 is a pentapolymer incorporating monomers M1, M2, M3, M4 and M5, where the mole percentage of M1/M2/M3/M4/M5 is 20/20/30/20/10 for a total of 100 mole percent of monomers. The Mw of the polymer was 8,000 g/mol. Note that the PAG (see Table 2), base (t-butyloxycarbonyl-4-hydroxypyridine, TBOC-4HP), and surface leveling agent (surfactant) PF 656, available from Omnova, are in weight percent based on 100% solids content, with the balance of the solids being the polymer. The solvents used in these formulations are PGMEA (S1) and HBM (S2).

The final % solids in both examples were 4 wt %. The weight ratio of solvent S1:S2 in the final formulation was 1:1. Photoresist formulation compositions for Comparative Example and Examples 1 and 2 are shown in Table 2 below:

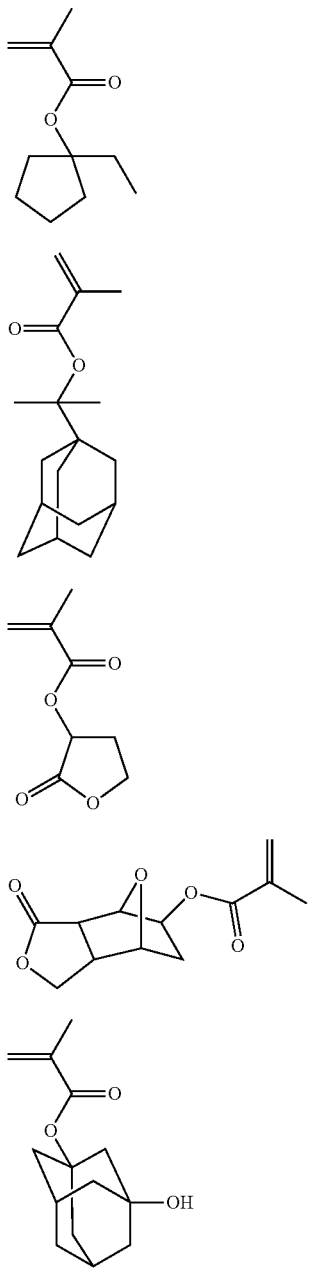

TABLE 2

| Sample | PAG | PAG (wt %) | Base (wt %) | SLA (wt %) |
|---|---|---|---|---|
| Comparative Example | Triphenylsulfonium perfluorobutane-sulfonate | 9.56 | 1.03 | 0.1 |
| Example 1 | PAG-A3 | 10.61 | 1.03 | 0.1 |
| Example 2 | PAG-A4 | 10.37 | 1.03 | 0.1 |

The above photoresists were lithographically processed as follows. The photoresist was spin coated onto a 200 mm silicon wafer having 84 nm of an organic antireflective coating (AR™77, Dow Electronic Materials) and baked at 110° C. for 60 seconds, to form a resist film 100 nm in thickness. The photoresist was exposed with ArF excimer laser (193 nm) through a mask pattern targeting a line and space pattern (L/S pattern) having a line width of 90 nm and a pitch of 180 nm, using an ArF exposure apparatus ASML-1100 (manufactured by ASML), NA (numerical aperture)=0.75 under annular illumination with outer/inner sigma of 0.89/0.64 with focus offset/step 0.10/0.05. The wafers were post exposure baked (PEB) at 100° C. for 60 seconds followed by developing with 0.26 N aqueous tetramethylammonium hydroxide (TMAH) developer and subsequent water wash.

In each example, a L/S pattern having a line width of 90 nm and a pitch of 180 nm was formed. Mask Error Factor (MEF) and Exposure Latitude (EL) were determined by processing the image captured by top-down scanning electron microscopy (SEM) using a Hitachi 9380 CD-SEM, operating at an accelerating voltage of 800 volts (V), probe current of 8.0 picoamperes (pA), using 200 Kx magnification. Exposure latitude (EL) was defined as a difference in exposure energy to print +/−10% of the target diameter normalized by the sizing energy. Mask Error Factor (MEF) was defined as the ratio of CD change on the resolved resist pattern to the relative dimension change on the mask pattern.

The results form the lithographic evaluation of the above photoresist formulations are reported in Table 3.

TABLE 3

| Example | $E_{size}$ (mJ/cm$^2$) | MEF | EL @10% of CD Target |
|---|---|---|---|
| Comparative Example | 24.35 | 4.158 | 10.31 |
| Example 2 | 31.06 | 3.36 | 12.31 |
| Example 3 | 39.80 | 3.52 | 11.80 |

As seen in Table 3, Examples 2 and 3, which utilizes the PAG-A1 and PAG-A2 respectively, showed the improved lithographic performance of greater exposure latitude, and improved mask error factor.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A compound having the formula (I):

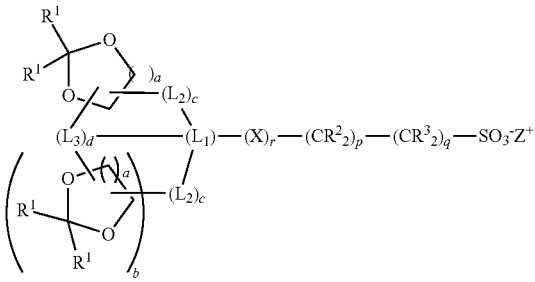

(I)

wherein each $R^1$ is independently H or a substituted or unsubstituted $C_{1-30}$ aliphatic group optionally bonded to an adjacent $R^1$, each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F, $L^1$, $L^2$ and $L^3$ are each independently a single bond, or a $C_{1-20}$ linking group optionally comprising a lactone group, wherein one or more of $L^1$, $L^2$ and $L^3$ optionally form a ring structure wherein all structures

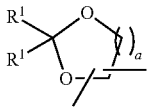

form a fused acetal- or ketal-containing ring with the ring structure formed by one or more of $L^1$, $L^2$ and $L^3$, and wherein one or more of $L^1$, $L^2$ and $L^3$ is optionally substituted with a polymerizable $C_{2-20}$ alpha-beta unsaturated organic group, X is an ether, ester, carbonate, amine, amide, urea, sulfate, sulfonate, or sulfonamide-containing group, $Z^+$ is an organic or inorganic cation, and each a is independently an integer of 1 to 12, b is an integer of 1 to 5, each c is 1, d and r are each independently 0 or 1, and p is an integer of from 0 to 10, and q is an integer of from 1 to 10.

2. The compound of claim 1, wherein $Z^+$ is a cation of the formula (V):

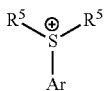

(V)

wherein each $R^5$ is independently substituted or unsubstituted $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{6-20}$ aryl, $C_{6-20}$ fluoroaryl, $C_{5-20}$ heteroaryl, $C_{7-20}$ aralkyl, $C_{7-20}$ fluoroaralkyl, $C_{6-20}$ heteroaralkyl, where each $R^5$ is separate or connected to the other group $R^5$, and Ar is a $C_{5-30}$ aromatic-containing group.

3. The compound of claim 2, wherein the cation is of the formulas (VI), (VII), or (VIII):

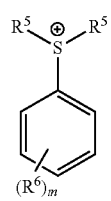

(VI)

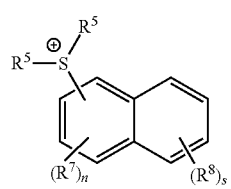

(VII)

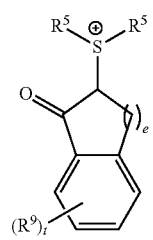

(VIII)

wherein each $R^5$ is independently substituted or unsubstituted $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{6-20}$ aryl, $C_{6-20}$ fluoroaryl, $C_{5-20}$ heteroaryl, $C_{7-20}$ aralkyl, $C_{7-20}$ fluoroaralkyl, or $C_{6-20}$ heteroaralkyl, wherein each $R^5$ is separate or connected to the other $R^5$;

$R^6$, $R^7$, $R^8$ and $R^9$ are each independently H, a halogen, $C_{1-20}$ alkyl, $C_{1-20}$ fluoroalkyl, $C_{1-20}$ alkoxy, $C_{1-20}$ fluoroalkoxy, $C_{1-20}$ thioalkoxy, $C_{1-20}$ fluorothioalkoxy, $C_{1-20}$ alkoxycarbonyl, $C_{1-20}$ fluoroalkoxycarbonyl, $C_{1-20}$ thioalkoxycarbonyl, $C_{1-20}$ fluorothioalkoxycarbonyl, $C_{3-20}$ cycloalkyl, $C_{3-20}$ fluorocycloalkyl, $C_{3-20}$ cycloalkoxy, $C_{3-20}$ fluorocycloalkoxy, $C_{2-20}$ alkenyl, $C_{2-20}$ fluoroalkenyl, $C_{6-20}$ aryl, $C_{6-20}$ fluoroaryl, $C_{6-20}$ aryloxy, $C_{6-20}$ fluoroaryloxy, $C_{5-20}$ heteroaryl, $C_{5-20}$ heteroaryloxy, $C_{7-20}$ aralkyl, $C_{7-20}$ fluoroaralkyl, $C_{7-20}$ aralkyloxy $C_{7-20}$ fluoroaralkyloxy, or $C_{6-20}$ heteroaralkyl, or $C_{6-20}$ heteroaralkyloxy, wherein $R^6$, $R^7$, $R^8$ and $R^9$ are each independently unsubstituted or further substituted to include an acid-labile group, a base-labile group, or a base-soluble group, and m is an integer of 1 to 5, n is an integer of 0 to 3, s is an integer of 0 to 4, t is an integer of 0 to 4, and e is an integer of 0 to 4.

4. The compound of claim 1, wherein $Z^+$ is of the formula (IX), (X), (XI), or (XII):

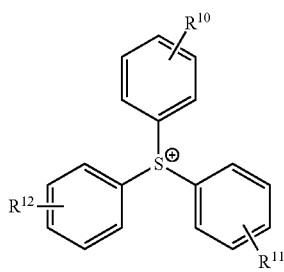

(IX)

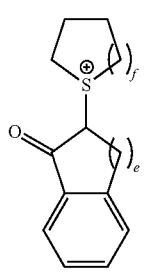

(X)

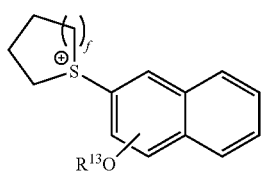

(XI)

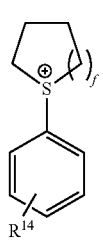

(XII)

wherein $R^{10}$, $R^{11}$, $R^{12}$ and $R^{14}$ are independently H, a halogen, $C_{1-10}$ alkyl, $C_{1-10}$ fluoroalkyl, $C_{1-10}$ alkoxy, $C_{1-10}$ fluoroalkoxy, $C_{3-10}$ cycloalkyl, $C_{3-10}$ fluorocycloalkyl, $C_{3-10}$ cycloalkoxy, or $C_{3-10}$ fluorocycloalkoxy, $R^{13}$ is H, $C_{1-10}$ alkyl, $C_{1-10}$ fluoroalkyl, $C_{3-10}$ cycloalkyl, or $C_{3-10}$ fluorocycloalkyl, and e and f are each independently 1 or 2.

5. A photoresist composition, comprising:
an acid-sensitive polymer, and
a compound of claim 1.

6. A coated substrate, comprising: (a) a substrate having one or more layers to be patterned on a surface thereof; and (b) a layer of a photoresist composition of claim 5 over the one or more layers to be patterned.

7. A method of forming an electronic device, comprising: (a) applying a layer of a photoresist composition of claim 5 on a substrate; (b) patternwise exposing the photoresist composition layer to activating radiation; and (c) developing the exposed photoresist composition layer to provide a resist relief image.

8. The method of claim 7, wherein the radiation is 193 nm or 248 nm radiation.

9. A compound having the formula (II):

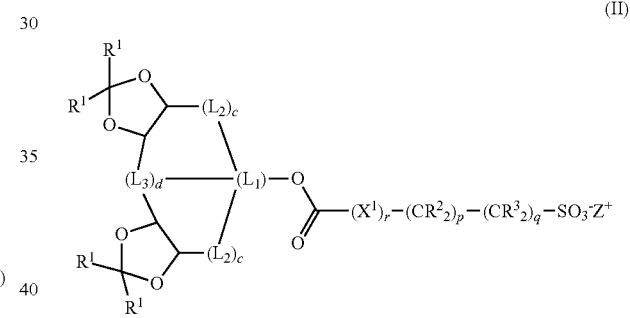

(II)

wherein each $R^1$ is independently H or a substituted or unsubstituted $C_{1-30}$ aliphatic group that may be bonded to an adjacent $R^1$, each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F, $L^1$, $L^2$ and $L^3$ are each independently a single bond, or a $C_{1-20}$ linking group that may comprise a lactone group, wherein one or more of $L^1$, $L^2$ and $L^3$ may form a ring structure, and wherein one or more of $L^1$, $L^2$ and $L^3$ may be substituted with a polymerizable $C_{2-20}$ alpha-beta unsaturated organic group, $X^1$ is O, $Z^+$ is an organic or inorganic cation, each c, d, and r is independently 0 or 1, p is an integer of from 0 to 10, and q is an integer of from 1 to 10.

10. A compound having the formulas (II-a) to (II-c):

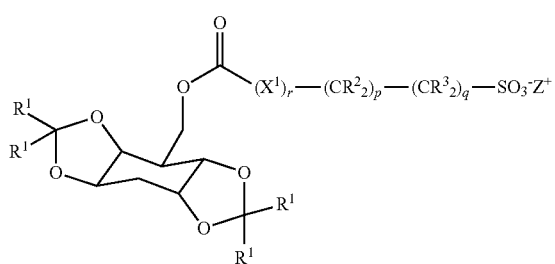
(II-a)

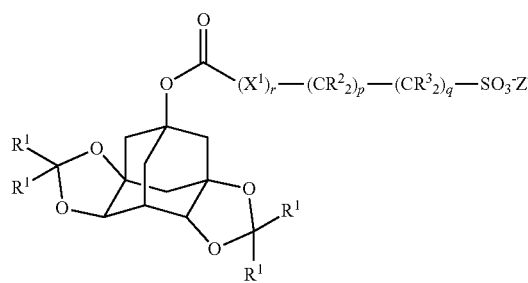
(II-b)

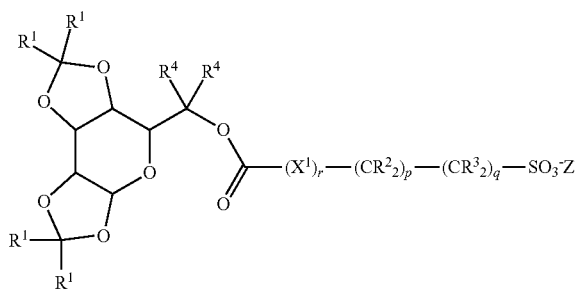
(II-c)

wherein
  each $R^1$ is independently H or a substituted or unsubstituted $C_{1-30}$ aliphatic group that may be bonded to an adjacent $R^1$,
  each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F,
  $X^1$ is O,
  $Z^+$ is an organic or inorganic cation,
  p is an integer of from 0 to 10,
  q is an integer of from 1 to 10,
  r is independently 0 or 1, and
  $R^4$ in formula (II-c) is H, $C_{1-10}$ alkyl, or $C_{3-10}$ cycloalkyl.

11. A compound having the formula (III):

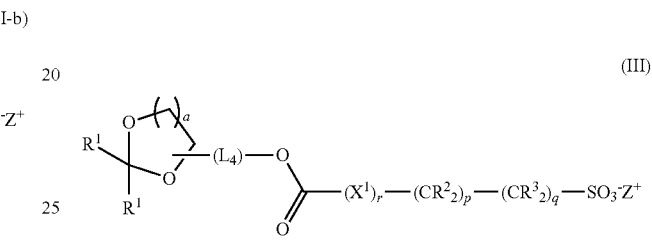
(III)

wherein
  each $R^1$ is independently H or a substituted or unsubstituted $C_{1-30}$ aliphatic group that may be bonded to an adjacent $R^1$,
  each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F,
  $X^1$ is O,
  $L_4$ is a $C_{1-20}$ lactone-containing linking group,
  $Z^+$ is an organic or inorganic cation,
  a is independently an integer of 1 to 12,
  p is an integer of from 0 to 10,
  q is an integer of from 1 to 10, and
  r is independently 0 or 1.

12. A compound having the formula (III-a) or (III-b):

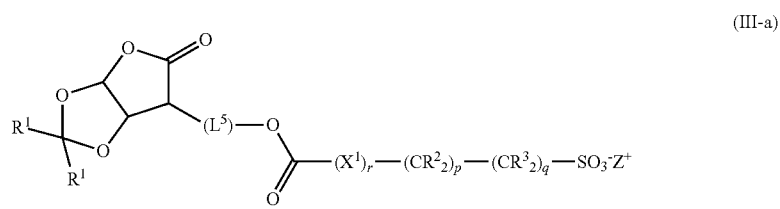
(III-a)

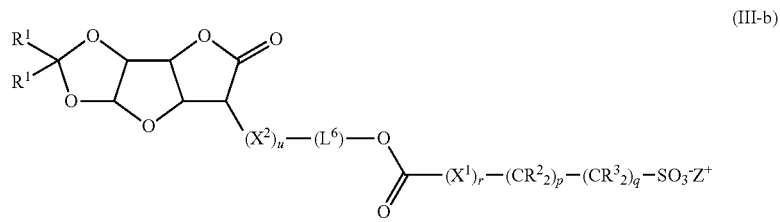
(III-b)

wherein
- each $R^1$ is independently H or a substituted or unsubstituted $C_{1-30}$ aliphatic group that may be bonded to an adjacent $R^1$,
- each $R^2$ and $R^3$ is independently H, F, $C_{1-10}$ alkyl, $C_{1-10}$ fluoroalkyl, $C_{3-10}$ cycloalkyl or $C_{3-10}$ fluorocycloalkyl, wherein at least one $R^2$ and/or $R^3$ contains F,
- $L^5$ and $L^6$ are independently a single bond or a $C_{1-10}$ linking group,
- X is an ether, ester, carbonate, amine, amide, urea, sulfate, sulfonate, or sulfonamide-containing group,
- $X^1$ and $X^2$ are independently O or NR where R is H or a $C_{1-6}$ alkyl,
- p is an integer of from 0 to 10,
- q is an integer of from 1 to 10,
- r is independently 0 or 1,
- and u is 0 or 1.

\* \* \* \* \*